(12) United States Patent
Stoschus et al.

(10) Patent No.: US 11,508,551 B2
(45) Date of Patent: Nov. 22, 2022

(54) DETECTION AND CORRECTION OF SYSTEM RESPONSES IN REAL-TIME

(71) Applicant: KLA CORPORATION, Milpitas, CA (US)

(72) Inventors: Henning Stoschus, Wetzlar (DE); Stefan Eyring, Weilburg (DE); Christopher Sears, Fremont, CA (US)

(73) Assignee: KLA CORPORATION, Milpitas, CA (US)

( * ) Notice: Subject to any disclaimer, the term of this patent is extended or adjusted under 35 U.S.C. 154(b) by 1 day.

(21) Appl. No.: 16/691,847

(22) Filed: Nov. 22, 2019

(65) Prior Publication Data

US 2020/0194224 A1 Jun. 18, 2020

Related U.S. Application Data

(60) Provisional application No. 62/779,485, filed on Dec. 14, 2018, provisional application No. 62/781,412, (Continued)

(51) Int. Cl.
*H01J 37/28* (2006.01)
*H01J 37/304* (2006.01)
(Continued)

(52) U.S. Cl.
CPC ........ *H01J 37/304* (2013.01); *G01N 23/2251* (2013.01); *G06N 20/00* (2019.01);
(Continued)

(58) Field of Classification Search
CPC ........ H01J 37/304; H01J 37/222; H01J 37/28; G01N 23/2251
See application file for complete search history.

(56) References Cited

U.S. PATENT DOCUMENTS 5,557,105 A * 9/1996 Honjo ..................... H01J 37/04
250/310
6,326,798 B1 12/2001 Kuribara
(Continued)

FOREIGN PATENT DOCUMENTS

CN 103718268 A 4/2014
CN 107533943 A 1/2018
(Continued)

OTHER PUBLICATIONS

Malac et al. 'Phase plates in the transmission electron microscope: operating principles and applications' Nov. 15, 2020 Microscopy 2021, 75-115.*

(Continued)

*Primary Examiner* — Eliza W Osenbaugh-Stewart
(74) *Attorney, Agent, or Firm* — Hodgson Russ LLP

(57) ABSTRACT

A detection and correction method for an electron beam system are provided. The method includes emitting an electron beam towards a specimen; modulating a beam current of the electron beam to obtain a beam signal. The method further includes detecting, using an electron detector, secondary and/or backscattered electrons emitted by the specimen to obtain electron data, wherein the electron data defines a detection signal. The method further includes determining, using a processor, a phase shift between the beam signal and the detection signal. The method further includes filtering, using the processor, the detection signal based on the phase shift.

20 Claims, 10 Drawing Sheets

Related U.S. Application Data filed on Dec. 18, 2018, provisional application No. 62/785,164, filed on Dec. 26, 2018.

(51) Int. Cl.
*G01N 23/2251* (2018.01)
*H01J 37/22* (2006.01)
*H01L 21/66* (2006.01)
*G06N 20/00* (2019.01)

(52) U.S. Cl.
CPC ............ *H01J 37/222* (2013.01); *H01L 22/12* (2013.01); *H01J 2237/221* (2013.01); *H01J 2237/24475* (2013.01)

(56) References Cited

U.S. PATENT DOCUMENTS

| | | | |
|---|---|---|---|
| 2005/0045820 A1* | 3/2005 | Ohshima | H01J 37/28 250/310 |
| 2010/0051807 A1 | 3/2010 | Barton et al. | |
| 2011/0049363 A1 | 3/2011 | Koch | |
| 2012/0019648 A1 | 1/2012 | Hoshino et al. | |
| 2014/0319342 A1 | 10/2014 | Fan et al. | |
| 2020/0111638 A1* | 4/2020 | Araki | H01J 37/243 |

FOREIGN PATENT DOCUMENTS

| | | |
|---|---|---|
| JP | 2013251212 A | 12/2013 |
| KR | 20160003798 A | 1/2016 |
| WO | 2010084860 A1 | 7/2010 |

OTHER PUBLICATIONS

Yasin et al., 'Atunable path-separated electron interfometer with an amplitude-dividing grating beamsplitter', Nov. 7, 2018, Appl. Phys. Lett. 113, 233102.*
WIPO, ISR for PCT/US2019/065829, Apr. 20, 2020.
CNIPA, First Office Action for CN Application No. 201980079627.1, dated Apr. 21, 2022.

* cited by examiner

201

202

DETECTION AND CORRECTION OF SYSTEM RESPONSES IN REAL-TIME

CROSS REFERENCE TO RELATED APPLICATIONS

This application claims priority to the provisional patent application filed Dec. 14, 2018 and assigned U.S. App. No. 62/779,485, the provisional patent application filed Dec. 18, 2018 and assigned U.S. App. No. 62/781,412, and the provisional patent application filed Dec. 26, 2018 and assigned U.S. App. No. 62/785,164, the disclosures of which are hereby incorporated by reference.

FIELD OF THE DISCLOSURE

The disclosure generally relates to improvements in semiconductor wafer metrology. More particularly the disclosure generally relates to methods and systems for reducing systematic error in electron beam measurements.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

The measurements of the overlay between different semiconductor layers are crucial for ensuring the functionality of integrated circuits (ICs). As the size of structures scale down, electron beam (EB) systems, e.g., EB inspection, review, and metrology systems, based on the principle of scanning electron microscopes become more and more attractive due to their high-resolution capabilities. However, EB systems may suffer from systematic error contributions reducing the theoretically possible accuracy, and thus perturbing measurement results.

One previous method relied on a single offline measurement of internal latencies and a correction for them. Changes of these latencies are not covered by the measurement. The internal latencies can lead to shifts or asymmetries of the detected image, thus resulting in error contributions in distance measurements. Changes in the latencies on a short time scale can act as an additional source of noise. Changes in the latencies on a long time scale can show up as drift-like effects.

Detection of secondary electrons (SEs) is beneficial as they are produced in a sample in a small interaction volume close to the surface thus resulting in a precise measurement with high spatial resolution. However, the SE signal is perturbed by other electron sources, mainly, back-scattered electrons (BSEs) with a broad-band energy distribution. Present band-path energy filters can discriminate the BSEs with high energy. Low and medium energy BSEs typically pass through the band-pass filter adding an additional background signal to the SE signal. Hence, the measured detector signal represents a combination of both SE and parasitic, low to medium energy backscattered electron signals. In such prior art solutions, the parasitic BSE contribution can lead to blurry pictures resulting in significant systematic errors.

Some previous methods rely on a static pre-alignment of a beam axis relative to the optical axis by aligning the image symmetry of specialized target structures or specialized sensors, as illustrated in FIGS. 1 and 2A-2C. But, the beam alignment has a direct impact on measurements of distances or positions in different heights of the specimen. In addition, the orientation of the specimen might slightly change from load to load requiring a new alignment of the beam. Keeping the old orientation leads to a tilt-induced error.

Therefore, improved methods and systems for reducing systematic error in EB measurements are needed.

SUMMARY OF THE DISCLOSURE

Embodiments of the present disclosure serve purposes including: (1) reducing systematic errors in high-resolution EB measurements by determining, tracking, and correcting tool-internal response; (2) reducing systematic errors in high-resolution EB measurements by improving methods of secondary electron (SE) detection—embodiments are not limited to overlay measurement and can be used for both semiconductor metrology and inspection; and (3) reducing systematic errors in EB measurements by measuring and aligning the beam orientation with respect to the specimen's surface normal.

Embodiments may correct a detection signal by modulating beam parameters, detector or filter parameters, or using asymmetry detection to correct beam tilt.

Embodiment methods and systems may detect a response of a system due to a perturbation of the system, determine correction metrics to the response, and apply the correction metrics. Measuring devices used to detect a response of a system may include metrology, inspection, and review electron beam tools. The response of the system due to a perturbation may be defined as given intrinsically by the system and detected by merits, may be induced by an on-purpose perturbation of the beam parameters, or may be induced by external sources. The perturbation of the beam parameters may be periodic with a given defined frequency. The perturbation may be intrinsic, for example, due to beam tilt. The perturbation may be external, for example, due to magnetic fields.

Embodiments may include a method, comprising emitting an electron beam towards a specimen; modulating a beam current of the electron beam to obtain a beam signal; detecting, using an electron detector, secondary and/or backscattered electrons emitted by the specimen to obtain electron data, wherein the electron data defines a detection signal; determining, using a processor, a phase shift between the beam signal and the detection signal; and filtering, using the processor, the detection signal based on the phase shift.

The method may further comprise applying a high-pass filter to the detection signal to obtain backscattered electron data.

Filtering the detection signal may further include subtracting the backscattered electron data from the electron data to obtain secondary electron data.

Filtering the detection signal may further include extrapolating, using the processor, a spectral distribution of the backscattered electron data towards a lower energy, thereby yielding an extrapolated backscattered electron data; and subtracting, using the processor, the extrapolated backscattered electron data from the electron data to obtain secondary electron data.

Filtering the detection signal may further include modelling, using the processor, an energy distribution function of the backscattered electron data, thereby yielding a modeled energy distribution function; and calibrating, using the processor, the modeled energy distribution function using one or more measurements taken using the electron beam tool.

Filtering the detection signal may further include determining a relative fraction that is a ratio of an intensity of the backscattered electron data to an intensity of the electron data.

The relative fraction may be stored on an electronic data storage unit.

Filtering the detection signal may further include using a machine learning model, and the machine learning model may be trained using the stored relative fraction stored on the electronic data storage unit.

The method may further comprise, detecting, using an opposing electron detector, secondary and/or backscattered electrons to obtain opposing electron data; comparing, using the processor, the electron data and the opposing electron data to generate tilt data; and changing a tilt of the electron beam using the tilt data.

Embodiments may include a system, comprising an electron beam tool and a controller in electronic communication with the electron beam tool.

The electron beam tool may include an electron beam emitter, a stage, and an electron detector. The electron beam emitter may be configured to emit electrons in an electron beam toward a specimen held on the stage. The electron detector may be configured to detect secondary and/or backscattered electrons emitted by the specimen to obtain electron data, wherein the electron data defines a detection signal.

The controller may have a processor. The controller may be configured to instruct the electron beam emitter to modulate parameter beam current of the electron beam to obtain a beam signal; determine a phase shift between the beam signal and the detection signal; and filter the detection signal using the phase shift.

The controller may be further configured to apply a high-pass filter to the detection signal to obtain backscattered electron data.

The controller may be configured to filter the detection signal by subtracting the backscattered electron data from the electron data to obtain secondary electron data.

The controller may be configured to filter the detection signal by extrapolating a spectral distribution of the backscattered electron data towards a lower energy, thereby yielding an extrapolated backscattered electron data; and subtracting the extrapolated backscattered electron data from the electron data to obtain secondary electron data.

The controller may be configured to filter the detection signal by modelling an energy distribution function of the backscattered electron data, thereby yielding a modeled energy distribution function; and calibrating the modeled energy distribution function using one or more measurements taken using the electron beam tool.

The controller may be configured to filter the detection signal by determining a relative fraction that is a ratio of an intensity of the backscattered electron data to an intensity of the electron data.

The system may further comprise an electronic data storage unit configured to store the relative fraction.

The controller may be configured to filter the detection signal by using a machine learning model. The machine learning model may be trained using the stored relative fraction stored on the electronic data storage unit.

The system may further comprise an opposing electron detector configured to detect secondary and/or backscattered electrons emitted by the specimen to obtain opposing electron data. The controller may be further configured to compare the electron data and the opposing electron data to generate tilt data; and change an angle of the electron beam emitter using the tilt data, thereby changing a tilt of the electron beam.

Embodiments may include a non-transitory computer-readable storage medium, comprising one or more programs for executing steps on one or more computing devices including the following steps. Instructing an electron beam tool to emit an electron beam based towards a specimen; modulating a beam current of the electron beam to obtain a beam signal; receiving electron data from an electron detector detecting secondary and/or backscattered electrons emitted by the specimen, wherein the electron data defines a detection signal; determining a phase shift between the beam signal and the detection signal; and filtering the detection signal based on the phase shift to obtain a filtered detection signal.

The steps may include training a machine-learning algorithm using the electron beam parameter, the electron data, and the filtered detection signal.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein include methods, systems, and apparatuses for correcting and responding to systematic errors in an electron beam inspection tool. Such embodiments may provide real-time detection and correction of potential phase shifts and reduce systematic errors of the measurement. Thus, measurements may have higher accuracy.

Figure 1:
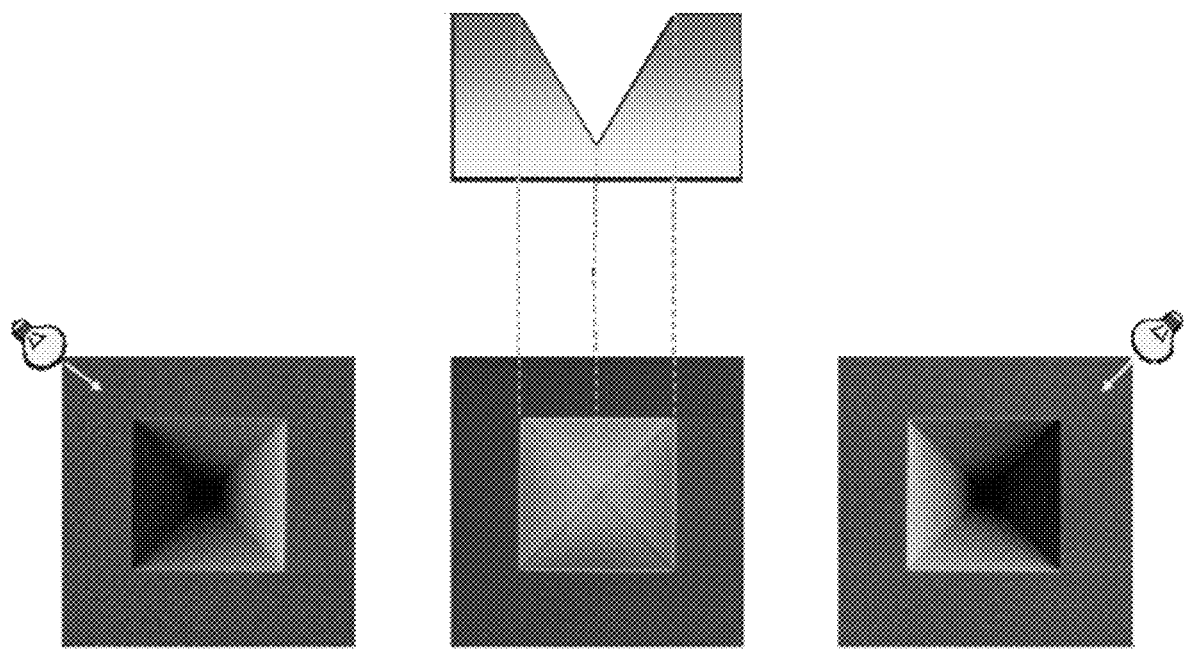
FIG. 1 illustrates a method of beam correction according to the prior art.
Figures 2A, 2B, 2C:
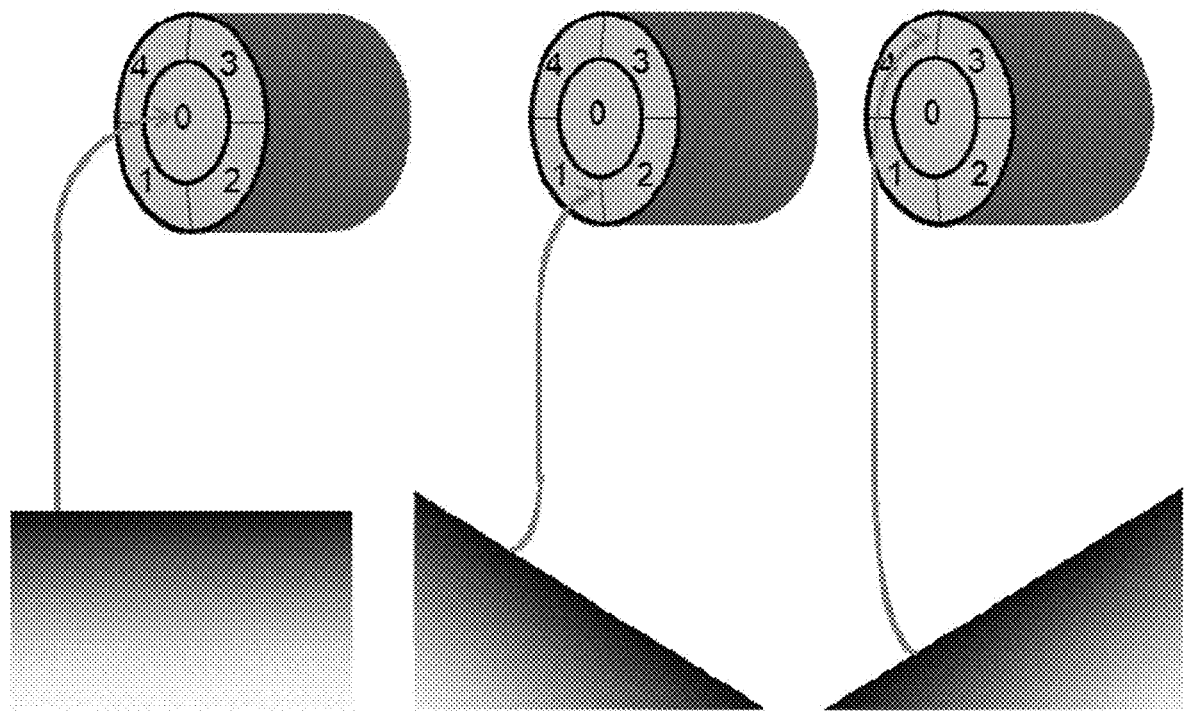
FIGS. 2A-2C illustrate a method of metrology correction according to the prior art.
Figure 3:
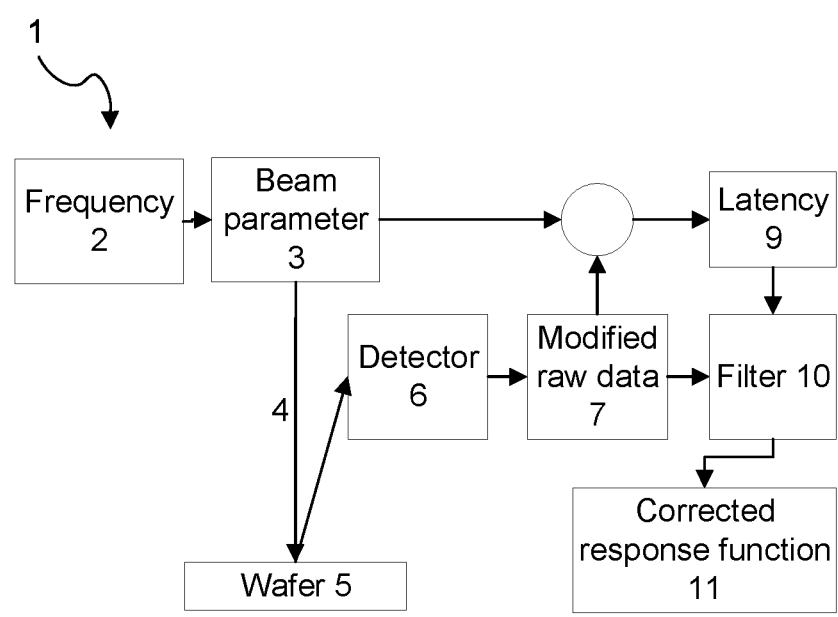
FIG. 3 illustrates a method of metrology correction according to an embodiment of the present disclosure.

In an instance, FIG. 3 depicts a first method of the present disclosure, which filters a detection signal, such as a warped sine wave, of an electron beam inspection tool. Method 1 may determine and correct for intrinsic static or dynamic response, for example, phase shift between the beam signal and the detection signal, by modulating the source properties with one or more defined frequencies at a defined amplitude. Method 1 may begin by generating a frequency 2, which may be modulated. The frequency 2 may be generated using a frequency generator. The frequency generated at 2 may be an input to producing a beam parameter 3, e.g., an electron beam current. The beam parameter 3 may be a parameter of primary beam 4. Beam parameter 3 may be modulated to obtain a beam signal. Primary beam 4 may be directed toward specimen 5, which may be a wafer or a die on a wafer. A portion of primary beam 4 may strike wafer 5 and cause a portion of the electrons near the surface of wafer 5 to scatter, yielding electrons, which may include secondary and backscattered electrons. A portion of the electrons may be detected by a detector 6, and electron data 7 may be produced. The electrons' modulation due to the modulation of beam parameter 3 can be analyzed with respect to the exciting modulation, for example, by means of a phase shift. The modulation can be filtered from the detection signal, and does not perturb the measurement. Electron data 7, which may define a detection signal received at detector 6, may be used with beam parameter(s) 3 to determine a phase shift 9 between the beam signal and the detection signal. Filter 10 may be used to filter modified raw data 7 (e.g., the electron data) using phase shift 9, to yield a filtered detection signal 11.

The primary beam 4 may be switched on and off, or may be moved to a dump-like structure to modulate the beam deflection. For example the dump-like structure may be a beam dump, and may include a blocking panel or metal sheet.

Analyzing the modified raw data 7 may include comparing the beam signal (e.g., a sine wave) 3 with the detection signal (e.g., a warped sine wave).

In another instance, a system may comprise an electron beam inspection tool. The electron beam inspection tool may comprise an electron beam emitter configured to emit electrons in an electron beam towards a specimen.

The electron beam inspection tool may further comprise a stage. The stage may be configured to hold the specimen. The specimen may be, for example, a wafer. The wafer may contain one or more dies. The specimen may be held by the stage in a path of the electron beam.

The electron beam inspection tool may further comprise a secondary electron detector, such as an Everhart-Thornely detector or a solid state detector, and may incorporate low-pass filter(s). The secondary electron detector may be configured to detect a portion of the secondary electrons generated as a result of the electron beam striking the specimen. The secondary electron detector may then yield electron data, representing the signals of electrons (primary, secondary, or backscattered) received at detector 6, as output after detecting electrons.

A controller may be in electronic communication with the inspection tool. The controller may be configured to instruct the electron beam emitter to, for example, modulate a frequency of an electron beam parameter of the electron beam. The controller may determine a phase shift between the beam signal and the detection signal. Using this phase shift, the controller may filter the detection signal to obtain a filtered detection signal. The way the detection signal is filtered may depend on what aspect of the detection signal is in need of correction. Where beam tilt modulation is necessary to correct the detection signal, a beam position correction can be performed. Where beam current modulation is necessary to correct the detection signal, image intensity corrections may be performed.

Another embodiment is a non-transitory computer-readable storage medium, which may comprise one or more programs for executing steps including those of method 1.

In other embodiments, electron detectors in various inspection tools may be improved. Emitting the electron beam toward the specimen may additionally cause a portion of the electrons in the specimen to backscatter, thus yielding backscattered electrons. The method may further comprise detecting a portion of the backscattered electrons at a backscatter electron detector, thus yielding a backscattered electron data, which may represent the signals received from backscattered electrons.

Figure 4:
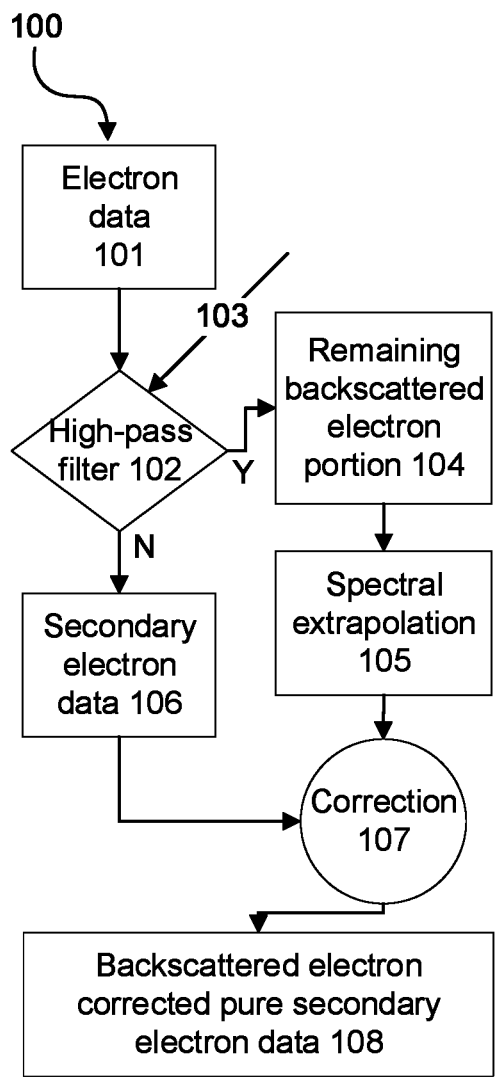
FIG. 4 illustrates a method of metrology correction according to an embodiment of the present disclosure.

In an embodiment depicted in FIG. 4, method 100 may be used to improve electron detectors in various inspection tools. Parasitic backscattered electron contributions can lead to significant systematic errors. Method 100 may clean the electron data 101 from parasitic backscattered electron contributions. It may determine and correct for the parasitic backscattered electron data by sweeping or cycling the bias voltage of an existing high-pass filter 102 using high frequency modulation 103 from values close to zero (high-pass off) to a few tens or hundreds of volts (high-pass on). Whether the high-pass filter 102 is in high-pass off or high-pass on mode depends on the strength of the filter voltage. The detected data in High-pass-off mode corresponds to backscattered electron and secondary electron data 106 while the High-pass-on represents the remaining backscattered electron portion 104. Optional spectral extrapolation 105 may be performed. The backscattered electron and secondary electron data is corrected 107 by the backscattered electron data to achieve a backscattered electron corrected pure secondary electron data 108.

In this way, a secondary electron detector may be improved. Secondary electron detectors may be used to dominantly receive data from the top layer for overlay application. A separate detector, e.g., a backscattered electron detector, may be used to receive data from the buried layer.

Such embodiments may operate to correct the data in real-time or offline.

Filtering the detection signal may further include subtracting the backscattered electron data from the secondary electron data.

Filtering the detection signal may further include extrapolating a spectral distribution (similar to the optical spectrum) of the backscattered electron data toward a lower energy. The extrapolation may be performed for example, by fitting a function to the spectrum and using that function to extrapolate to other spectral locations lacking measured data. This may yield an extrapolated backscattered electron data. The extrapolated backscattered electron data may be subtracted from the secondary electron data to yield the filtered detection signal.

Filtering the detection signal may further include modelling an energy distribution function of the backscattered electron data, thereby yielding a modeled energy distribution function. The modeled energy distribution function may be calibrated using one or more measurements taken using the electron beam inspection tool.

Filtering the detection signal may further include determining a relative fraction. The relative fraction may be a ratio of an intensity of the backscattered electron data to an intensity of the secondary electron data.

The relative fraction may be stored on an electronic data storage unit. One or more determined relative fractions may be stored in a look-up table for later use.

Filtering the detection signal may further include using a machine learning model. The machine learning module may be trained using the stored relative fraction stored on the electronic data storage unit. The machine learning model may be, for example, an artificial neural network, such as a convolutional neural network, and may apply the artificial neural network to new measurements.

Such embodiments provide for detecting by measuring the backscattered electron data and the backscattered electron and secondary electron data pixel by pixel. Other such embodiments provide for detecting by measuring the backscattered electron data and the backscattered electron data and secondary electron data by group of pixels (e.g., line by line or frame by frame). The same position may be measured for backscattered electron and backscattered electron-plus-secondary electron data. No calibration between different detectors may be necessary.

Embodiments may include hardware to control and synchronize a sweep or cycle of the filter bias voltage to other system time scales (e.g., the pixel clock or frame rate).

The method may further comprise detecting secondary and/or backscattered electrons at an opposing electron detector. Such detection may yield opposing electron data. The electron data may be compared with the opposing electron data to generate tilt data, which may refer to the alignment of the beam axis relative to the optical axis. The tilt of the electron beam may be changed using the tilt data. The tilt of the electron beam may be changed by changing the electron beam emitter.

The electron data maybe compared to the opposing electron data utilizing dark field images generated by the electron data measurements and the opposing electron data measurements in each pixel or group of pixels. Dark field images may be used for contrast enhancement and/or topographic measurements. Such images may be used to measure and control a beam tilt.

An embodiment may determine and correct for a beam tilt of an electron beam inspection system. A tilt-related value may be measured by comparing opposing channels using a multichannel detector. A comparison of the data, for example, between the electron data and the opposing electron data, may be used to control the beam tilt in real-time by means of a feedback loop. Such a feedback loop may be used to determine and correct for beam tilt in real time by determining a tilt-related value using opposing channels of a multichannel detector and a beam tilt calibration target.

One embodiment may implement a specialized target using a high-Z substrate and an aperture array. The high-Z substrate may be selected such that it generates backscattered electrons. For example, this may be a Pelco silicon nitride support film.

A system or non-transitory computer-readable storage medium according to the present disclosure may implement such various embodiments of the present disclosure.

Figure 5:
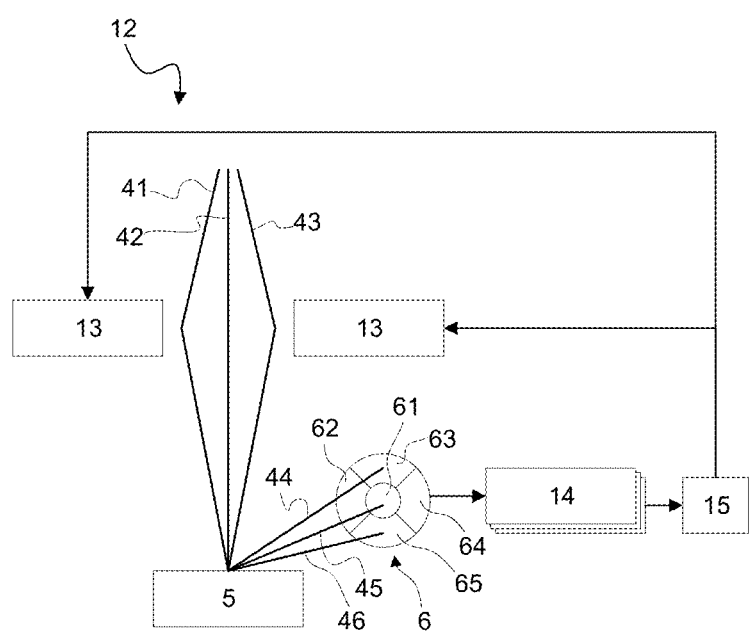
FIG. 5 illustrates a system for metrology correction according to an embodiment of the present disclosure.
Figure 7A:
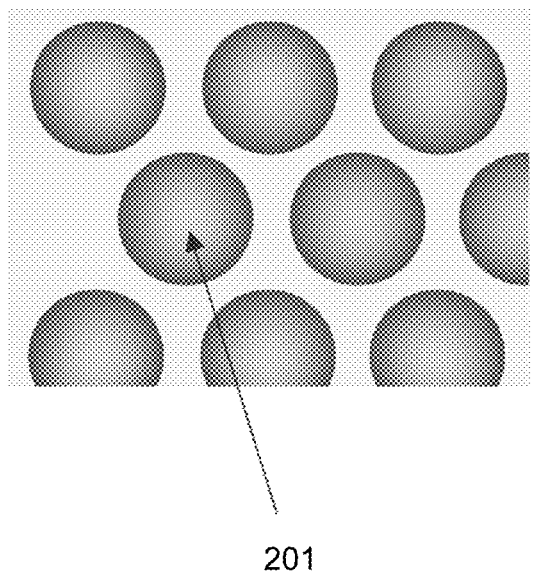
FIGS. 7A-7C illustrates an embodiment darkfield metrology correction.
Figure 7B:
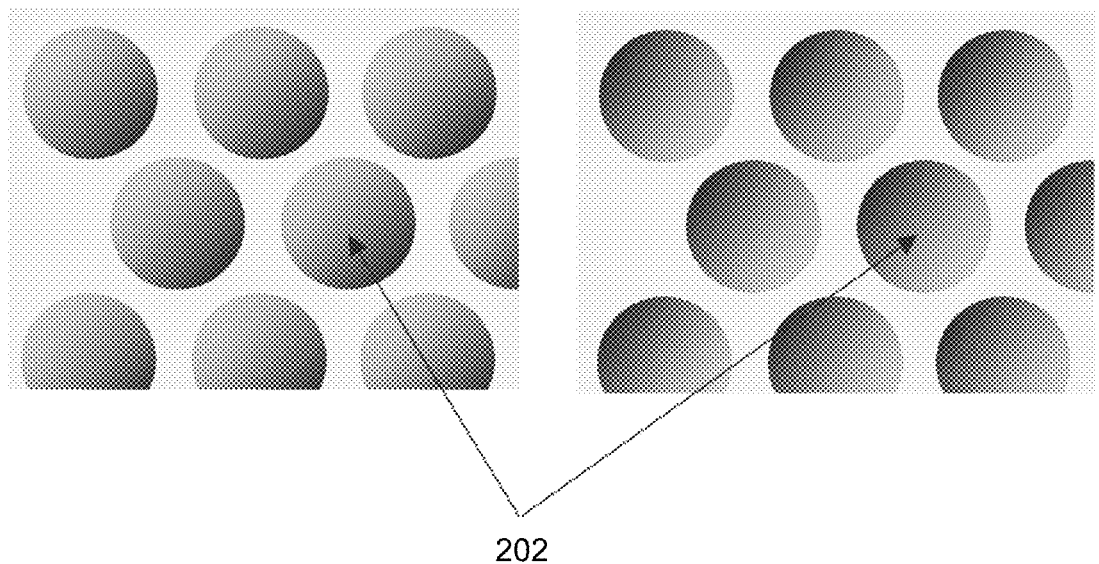
Figure 7C:
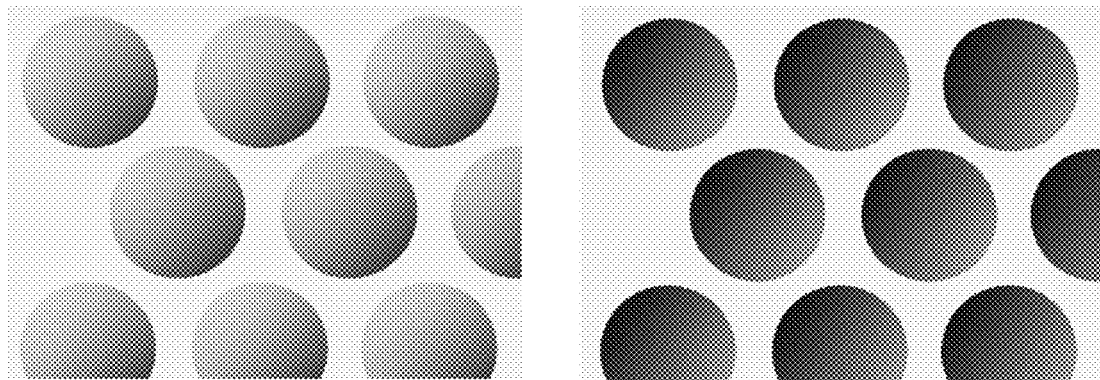

An embodiment system 12 is illustrated in FIG. 5. In system 12, primary beam components 41-43 may be appropriately deflected by a deflection unit 13 towards specimen 5. Portions of the secondary and backscattered electrons 44-46, resulting from primary beam components 41-43 striking specimen 5, may be detected at detector 6. Detector 6 may have one or more portions, for example portions 61-65, configured to detect secondary electrons and/or backscattered electrons at various angles, depending on the flatness or slantedness of a surface, to obtain a detection signal. It should be noted that there may be embodiments with varying number of portions, rather than portions 61-65. Detector 6 may be configured to supply one or more darkfield images 14 (generated using the detection signal) to an analysis unit 15. Examples of darkfield images 14 include those depicted in FIGS. 7A-7C, including images 201 and 202.

Figure 6:
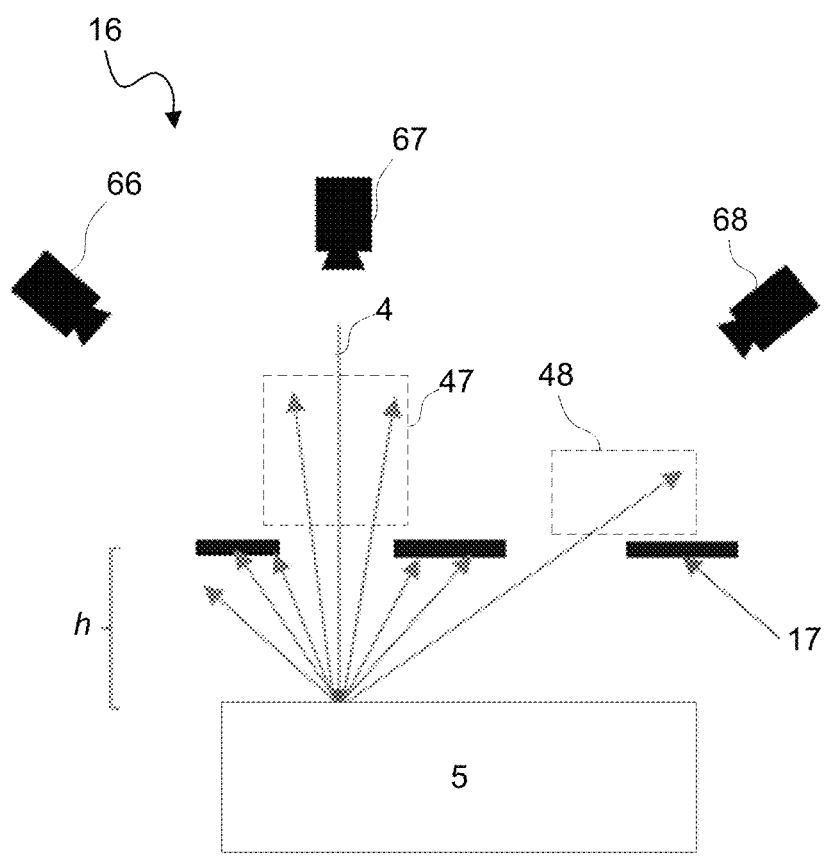
FIG. 6 illustrates a system for metrology correction according to an embodiment of the present disclosure.

FIG. 6 depicts yet another embodiment system 16, in which a membrane having holes is placed between the specimen 5 and the detectors 66-68. It should be noted that there may be embodiments with varying number of detectors, rather than detectors 66-68. The membrane having holes may be, for example 200 nm thick and/or made of silicon. However, another thickness or material may be used depending on the process needs. Membrane 17 having holes may have one or more holes, and those holes may be circular or other-shaped. For example, membrane 17 having holes may have circular holes with diameters ranging, for example from 2500 nm to 5000 nm. Specimen 5 may be a high-Z target for strong backscatter data. The membrane 17 having holes may be placed a distance h above specimen 5. For example, distance h may range from 2-10 μm, however another distance h may be used depending on process needs. Portions of backscattered electrons 47 and 48 may result from primary beam 4 striking specimen 5.

Referring back to FIG. 5, analysis unit 15 may analyze the darkfield images, for example by converting using image processing techniques (e.g., by comparing several side channels), to determine the tilt of the specimen. For example, referring to FIG. 7A, darkfield image 201 may show that the surface from which the scattered electrons emanate is flat. For a further example, referring to FIG. 7B, darkfield images 202 may show that the surface from which the scattered electrons emanate is tilted. In such a way, the tilt of the surface, which may correspond to the tilt of the specimen, may be measured, and fed back into the system for correction.

Figure 8:
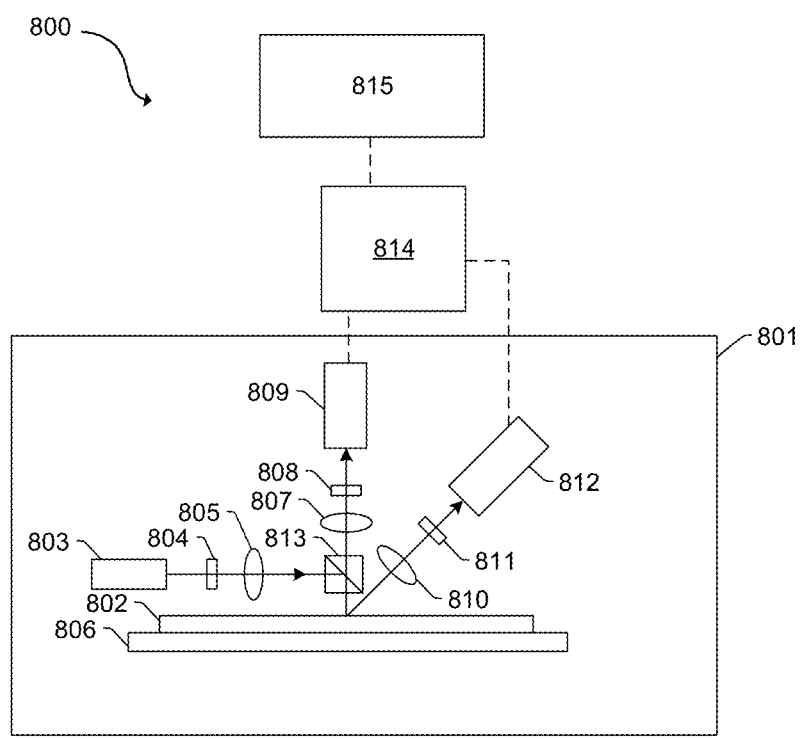
FIG. 8 illustrates a system embodiment of the present disclosure.

One embodiment of a system 800 is shown in FIG. 8. The system 800 includes optical based subsystem 801. In general, the optical based subsystem 801 is configured for generating optical based output for a specimen 802 by directing light to (or scanning light over) and detecting light from the specimen 802. In one embodiment, the specimen 802 includes a wafer.

The wafer may include any wafer known in the art. In another embodiment, the specimen includes a reticle. The reticle may include any reticle known in the art.

In the embodiment of the system 800 shown in FIG. 8, optical based subsystem 801 includes an illumination subsystem configured to direct light to specimen 802. The illumination subsystem includes at least one light source. For example, as shown in FIG. 8, the illumination subsystem includes light source 803. In one embodiment, the illumination subsystem is configured to direct the light to the specimen 802 at one or more angles of incidence, which may include one or more oblique angles and/or one or more normal angles. For example, as shown in FIG. 8, light from light source 803 is directed through optical element 804 and then lens 805 to specimen 802 at an oblique angle of incidence. The oblique angle of incidence may include any suitable oblique angle of incidence, which may vary depending on, for instance, characteristics of the specimen 802.

The light source 803, or beam source, can include a broadband plasma source, lamp, or laser. In some embodiments, the beam source can also emit light, or photons, which can be in the form of infrared, visible, ultraviolet, or x-ray light.

The optical based subsystem 801 may be configured to direct the light to the specimen 802 at different angles of incidence at different times. For example, the optical based subsystem 801 may be configured to alter one or more characteristics of one or more elements of the illumination subsystem such that the light can be directed to the specimen 802 at an angle of incidence that is different than that shown in FIG. 8. In one such example, the optical based subsystem 801 may be configured to move light source 803, optical element 804, and lens 805 such that the light is directed to the specimen 802 at a different oblique angle of incidence or a normal (or near normal) angle of incidence.

In some instances, the optical based subsystem 801 may be configured to direct light to the specimen 802 at more than one angle of incidence at the same time. For example, the illumination subsystem may include more than one illumination channel, one of the illumination channels may include light source 803, optical element 804, and lens 805 as shown in FIG. 8 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 802 at different angles of incidence may be different such that light resulting from illumination of the specimen 802 at the different angles of incidence can be discriminated from each other at the detector(s).

In another instance, the illumination subsystem may include only one light source (e.g., light source 803 shown in FIG. 8) and light from the light source may be separated into different optical paths (e.g., based on wavelength, polarization, etc.) by one or more optical elements (not shown) of the illumination subsystem. Light in each of the different optical paths may then be directed to the specimen 802. Multiple illumination channels may be configured to direct light to the specimen 802 at the same time or at different times (e.g., when different illumination channels are used to sequentially illuminate the specimen). In another instance, the same illumination channel may be configured to direct light to the specimen 802 with different characteristics at different times. For example, in some instances, optical element 804 may be configured as a spectral filter and the properties of the spectral filter can be changed in a variety of different ways (e.g., by swapping out the spectral filter) such that different wavelengths of light can be directed to the specimen 802 at different times. The illumination subsystem may have any other suitable configuration known in the art for directing the light having different or the same characteristics to the specimen 802 at different or the same angles of incidence sequentially or simultaneously.

In one embodiment, light source 803 may include a broadband plasma (BBP) source. In this manner, the light generated by the light source 803 and directed to the specimen 802 may include broadband light. However, the light source may include any other suitable light source such as a laser or lamp. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 803 may also include a polychromatic light source that generates light at multiple discrete wavelengths or wavebands.

Light from optical element 804 may be focused onto specimen 802 by lens 805. Although lens 805 is shown in FIG. 8 as a single refractive optical element, it is to be understood that, in practice, lens 805 may include a number of refractive and/or reflective optical elements that in combination focus the light from the optical element to the specimen. The illumination subsystem shown in FIG. 8 and described herein may include any other suitable optical elements (not shown). Examples of such optical elements include, but are not limited to, polarizing component(s), spectral filter(s), spatial filter(s), reflective optical element (s), apodizer(s), beam splitter(s) (such as beam splitter 813), aperture(s), and the like, which may include any such suitable optical elements known in the art. In addition, the optical based subsystem 801 may be configured to alter one or more of the elements of the illumination subsystem based on the type of illumination to be used for generating the optical based output.

The optical based subsystem 801 may also include a scanning subsystem configured to cause the light to be scanned over the specimen 802. For example, the optical based subsystem 801 may include stage 806 on which specimen 802 is disposed during optical based output generation. The scanning subsystem may include any suitable mechanical and/or robotic assembly (that includes stage 806) that can be configured to move the specimen 802 such that the light can be scanned over the specimen 802. In addition, or alternatively, the optical based subsystem 801 may be configured such that one or more optical elements of the optical based subsystem 801 perform some scanning of the light over the specimen 802. The light may be scanned over the specimen 802 in any suitable fashion such as in a serpentine-like path or in a spiral path.

The optical based subsystem 801 further includes one or more detection channels. At least one of the one or more detection channels includes a detector configured to detect light from the specimen 802 due to illumination of the specimen 802 by the subsystem and to generate output responsive to the detected light. For example, the optical based subsystem 801 shown in FIG. 8 includes two detection channels, one formed by collector 807, element 808, and detector 809 and another formed by collector 810, element 811, and detector 812. As shown in FIG. 8, the two detection channels are configured to collect and detect light at different angles of collection. In some instances, both detection channels are configured to detect scattered light, and the detection channels are configured to detect tight that is scattered at different angles from the specimen 802. However, one or more of the detection channels may be configured to detect another type of light from the specimen 802 (e.g., reflected light).

As further shown in FIG. 8, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 810, element 811, and detector 812 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 8 shows an embodiment of the optical based subsystem 801 that includes two detection channels, the optical based subsystem 801 may include a different number of detection channels (e.g., only one detection channel or two or more detection channels). In one such instance, the detection channel formed by collector 810, element 811, and detector 812 may form one side channel as described above, and the optical based subsystem 801 may include an additional detection channel (not shown) formed as another side channel that is positioned on the opposite side of the plane of incidence. Therefore, the optical based subsystem 801 may include the detection channel that includes collector 807, element 808, and detector 809 and that is centered in the plane of incidence and configured to collect and detect light at scattering angle(s) that are at or close to normal to the specimen 802 surface. This detection channel may therefore be commonly referred to as a "top" channel, and the optical based subsystem 801 may also include two or more side channels configured as described above. As such, the optical based subsystem 801 may include at least three channels (i.e., one top channel and two side channels), and each of the at least three channels has its own collector, each of which is configured to collect light at different scattering angles than each of the other collectors.

As described further above, each of the detection channels included in the optical based subsystem 801 may be configured to detect scattered light. Therefore, the optical based subsystem 801 shown in FIG. 8 may be configured for dark field (DF) output generation for specimens 802. However, the optical based subsystem 801 may also or alternatively include detection channel(s) that are configured for bright field (BF) output generation for specimens 802. In other words, the optical based subsystem 801 may include at least one detection channel that is configured to detect light specularly reflected from the specimen 802. Therefore, the optical based subsystems 801 described herein may be configured for only DF, only BF, or both DF and BF imaging. Although each of the collectors are shown in FIG. 8 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 814 may be configured to generate images of the specimen 802 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 8 is provided herein to generally illustrate a configuration of an optical based subsystem 801 that may be included in the system embodiments described herein or that may generate optical based output that is used by the system embodiments described herein. The optical based subsystem 801 configuration described herein may be altered to optimize the performance of the optical based subsystem 801 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

In an instance, the processor 814 is in communication with the system 800.

Figure 9:
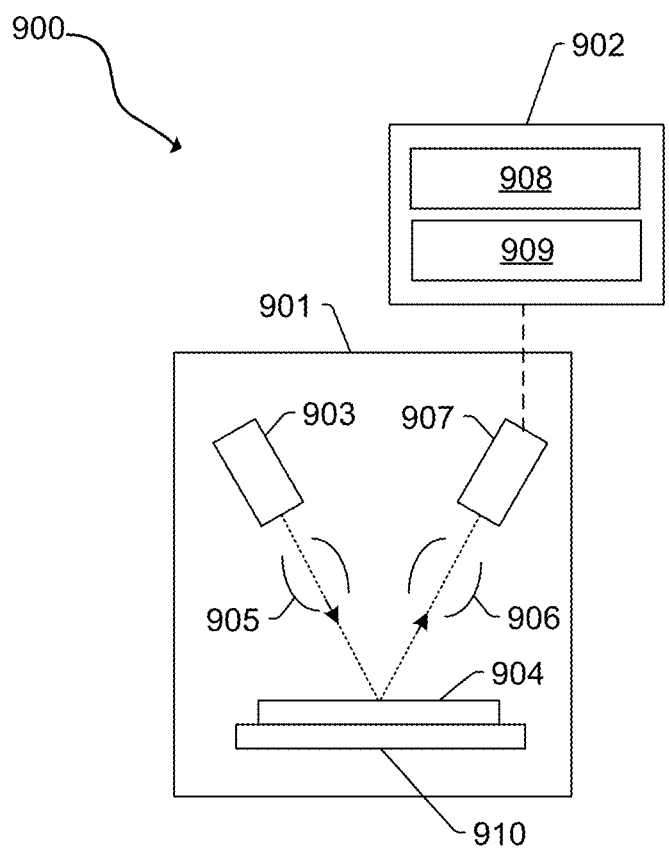
FIG. 9 illustrates another system embodiment of the present disclosure.

FIG. 9 is a block diagram of an embodiment of a system 900. The system 900 includes a tool, e.g., a wafer inspection tool (which includes the electron column 901), configured to generate images of a specimen 904, which may include a wafer or a reticle.

The tool includes an output acquisition subsystem that includes at least an energy source and a detector. The output acquisition subsystem may be an electron beam-based output acquisition subsystem. For example, in one embodiment, the energy directed to the specimen 904 includes electrons, and the energy detected from the specimen 904 includes electrons. In this manner, the energy source may be an electron beam source. In one such embodiment shown in FIG. 9, the output acquisition subsystem includes electron column 901, which is coupled to computer subsystem 902. A stage 910 may hold the specimen 904.

As also shown in FIG. 9, the electron column 901 includes an electron beam source 903 configured to generate electrons that are focused to specimen 904 by one or more elements 905. The electron beam source 903 may include, for example, a cathode source or emitter tip. The one or more elements 905 may include, for example, a gun lens, an anode, a beam limiting aperture, a gate valve, a beam current selection aperture, an objective lens, and a scanning subsystem, all of which may include any such suitable elements known in the art.

Electrons returned from the specimen 904 (e.g., secondary electrons) may be focused by one or more elements 906 to detector 907. One or more elements 906 may include, for example, a scanning subsystem, which may be the same scanning subsystem included in element(s) 905.

The electron column 901 also may include any other suitable elements known in the art.

Although the electron column 901 is shown in FIG. 9 as being configured such that the electrons are directed to the specimen 904 at an oblique angle of incidence and are scattered from the specimen 904 at another oblique angle, the electron beam may be directed to and scattered from the specimen 904 at any suitable angles. In addition, the electron beam-based output acquisition subsystem may be configured to use multiple modes to generate images of the specimen 904 (e.g., with different illumination angles, collection angles, etc.). The multiple modes of the electron beam-based output acquisition subsystem may be different in any image generation parameters of the output acquisition subsystem.

Computer subsystem 902 may be coupled to detector 907 as described above. The detector 907 may detect electrons returned from the surface of the specimen 904 thereby forming electron beam images of the specimen 904. The electron beam images may include any suitable electron beam images. Computer subsystem 902 may be configured to perform any of the functions described herein using the output of the detector 907 and/or the electron beam images.

Computer subsystem 902 may be configured to perform any additional step(s) described herein. A system 900 that includes the output acquisition subsystem shown in FIG. 9 may be further configured as described herein.

It is noted that FIG. 9 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 9 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 902 includes a processor 908 and an electronic data storage unit 909. The processor 908 may include a microprocessor, a microcontroller, or other devices.

The processor 814 or 908 or computer subsystem 902 may be coupled to the components of the system 800 or 900, respectively, in any suitable manner (e.g., via one or more transmission media, which may include wired and/or wireless transmission media) such that the processor 814 or 908, respectively, can receive output. The processor 814 or 908 may be configured to perform a number of functions using the output. The system 800 or 900 can receive instructions or other information from the processor 814 or 908, respectively. The processor 814 or 908 and/or the electronic data storage unit 815 or 909, respectively, optionally may be in electronic communication with a wafer inspection tool, a wafer metrology tool, or a wafer review tool (not illustrated) to receive additional information or send instructions. For example, the processor 814 908 and/or the electronic data storage unit 815 or 909, respectively, can be in electronic communication with a scanning electron microscope (SEM).

The processor 814 or 908 is in electronic communication with the wafer inspection tool, such as the detector 809 or 812, or detector 907, respectively. The processor 814 or 908 may be configured to process images generated using measurements from the detector 809 or 812, or detector 907, respectively. For example, the processor may perform embodiments of the method 100 or portions of schematic 1 or systems 12 and 16.

The processor 814 or 908 or computer subsystem 902, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 814 or 908 and electronic data storage unit 815 or 909, respectively, may be disposed in or otherwise part of the system 800 or 900, respectively, or another device. In an example, the processor 814 or 908 and electronic data storage unit 815 or 909, respectively may be part of a standalone control unit or in a centralized quality control unit. Multiple processors 814 or 908 or electronic data storage units 815 or 909, respectively, may be used.

The processor 814 or 908 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 814 or 908 to implement various methods and functions may be stored in readable storage media, such as a memory in the electronic data storage unit 815 or 909, respectively, or other memory.

If the system 800 or 900 includes more than one processor 814 or 908 or computer subsystem 902, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 814 or 908 may be configured to perform a number of functions using the output of the system 800 or 900, respectively, or other output. For instance, the processor 814 or 908 may be configured to send the output to an electronic data storage unit 815 or 909, respectively or another storage medium. The processor 814 or 908 may be further configured as described herein.

The processor 814 or 908 or computer subsystem 902 may be part of a defect review system, an inspection system, a metrology system, or some other type of system. Thus, the embodiments disclosed herein describe some configurations that can be tailored in a number of manners for systems having different capabilities that are more or less suitable for different applications.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 814 or 908 may be configured according to any of the embodiments described herein. The processor 814 or 908 also may be configured to perform other functions or additional steps using the output of the system 800 or 900, respectively, or using images or data from other sources.

The processor 814 or 908 may be communicatively coupled to any of the various components or sub-systems of system 800 or 900, respectively, in any manner known in the art. Moreover, the processor 814 or 908 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 814 or 908 and other subsystems of the system 800 or 900, respectively, or systems external to system 800 or 900, respectively.

In an embodiment, processor 814 or processor 908 may be configured to carry out the steps according to an embodiment of method 100 or portions of schematic 1 or systems 12 and 16.

In an embodiment, the processor 814 or processor 908 may be further configured to perform a fine alignment comprising of a partitioned translation, wherein the partitioned translation comprises: partitioning the reference image into one or more reference image sub-sections; partitioning the test image into one or more test image sub-sections, each test image sub-section corresponding to a reference image sub-section; and translating each test image sub-section is translated to align with its corresponding reference image sub-section.

Various steps, functions, and/or operations of system 800 or system 900 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 814 or a single processor 908 (or computer subsystem 902) or, alternatively, multiple processors 814 or multiple processors 908 (or multiple computer subsystems 902). Moreover, different sub-systems of the system 800 or system 900 may include one or more computing or logic systems. Therefore, the above description should not be interpreted as a limitation on the present disclosure but merely an illustration.

An additional embodiment relates to a non-transitory computer-readable medium storing program instructions executable on a controller for performing a computer-implemented method for determining a height of an illuminated region on a surface of a specimen 802 or 904, as disclosed herein. In particular, as shown in FIG. 8 or 9, electronic data storage unit 815 or 909 or other storage medium may contain non-transitory computer-readable medium that includes program instructions executable on the processor 814 or 908, respectively. The computer-implemented method may include any step(s) of any method(s) described herein, including embodiments of method 100 or portions of schematic 1 or systems 12 and 16.

Program instructions implementing methods such as those described herein may be stored on computer-readable medium, such as in the electronic data storage unit 815, electronic data storage unit 909, or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

The component(s) executed by the processor, can include a deep learning module (e.g., a convolutional neural network (CNN) module). The deep learning module can have one of the configurations described further herein. Rooted in neural network technology, deep learning is a probabilistic graph model with many neuron layers, commonly known as a deep architecture. Deep learning technology processes the information such as image, text, voice, and so on in a hierarchical manner. In using deep learning in the present disclosure, feature extraction is accomplished automatically using learning from data. For example, features to reference in determining rotation and translation offsets can be extracted using the deep learning module based on the one or more extracted features.

Generally speaking, deep learning (also known as deep structured learning, hierarchical learning or deep machine learning) is a branch of machine learning based on a set of algorithms that attempt to model high level abstractions in data. In a simple case, there may be two sets of neurons: ones that receive an input signal and ones that send an output signal. When the input layer receives an input, it passes on a modified version of the input to the next layer. In a deep network, there are many layers between the input and output, allowing the algorithm to use multiple processing layers, composed of multiple linear and non-linear transformations.

Deep learning is part of a broader family of machine learning methods based on learning representations of data. An observation (e.g., a feature to be extracted for reference) can be represented in many ways such as a vector of intensity values per pixel, or in a more abstract way as a set of edges, regions of particular shape, etc. Some representations are better than others at simplifying the learning task (e.g., face recognition or facial expression recognition). Deep learning can provide efficient algorithms for unsupervised or semi-supervised feature learning and hierarchical feature extraction.

Research in this area attempts to make better representations and create models to learn these representations from large-scale data. Some of the representations are inspired by advances in neuroscience and are loosely based on interpretation of information processing and communication patterns in a nervous system, such as neural coding which attempts to define a relationship between various stimuli and associated neuronal responses in the brain.

There are many variants of neural networks with deep architecture depending on the probability specification and network architecture, including, but not limited to, Deep Belief Networks (DBN), Restricted Boltzmann Machines (RBM), and Auto-Encoders. Another type of deep neural network, a CNN, can be used for feature analysis. The actual implementation may vary depending on the size of input images, the number of features to be analyzed, and the nature of the problem. Other layers may be included in the deep learning module besides the neural networks disclosed herein.

In an embodiment, the deep learning model is a machine learning model. Machine learning can be generally defined as a type of artificial intelligence (AI) that provides computers with the ability to learn without being explicitly programmed. Machine learning focuses on the development of computer programs that can teach themselves to grow and change when exposed to new data. Machine learning explores the study and construction of algorithms that can learn from and make predictions on data. Such algorithms overcome following strictly static program instructions by making data driven predictions or decisions, through building a model from sample inputs.

In some embodiments, the deep learning model is a generative model. A generative model can be generally defined as a model that is probabilistic in nature. In other words, a generative model is one that performs forward simulation or rule-based approaches. The generative model can be learned (in that its parameters can be learned) based on a suitable training set of data. In one embodiment, the deep learning model is configured as a deep generative model. For example, the model may be configured to have a deep learning architecture in that the model may include multiple layers, which perform a number of algorithms or transformations.

In another embodiment, the deep learning model is configured as a neural network. In a further embodiment, the deep learning model may be a deep neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically consist of multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In one embodiment, the deep learning model used for the semiconductor inspection applications disclosed herein is configured as an AlexNet. For example, an AlexNet includes a number of convolutional layers (e.g., 5) followed by a number of fully connected layers (e.g., 3) that are, in combination, configured and trained to analyze features for determining rotation and translation offsets. In another such embodiment, the deep learning model used for the semiconductor inspection applications disclosed herein is configured as a GoogleNet. For example, a GoogleNet may include layers such as convolutional, pooling, and fully connected layers such as those described further herein configured and trained to analyze features for determining rotation and translation offsets. While the GoogleNet architecture may include a relatively high number of layers (especially compared to some other neural networks described herein), some of the layers may be operating in parallel, and groups of layers that function in parallel with each other are generally referred to as inception modules. Other of the layers may operate sequentially. Therefore, GoogleNets are different from other neural networks described herein in that not all of the layers are arranged in a sequential structure. The parallel layers may be similar to Google's Inception Network or other structures.

In a further such embodiment, the deep learning model used for the semiconductor inspection applications disclosed herein is configured as a Visual Geometry Group (VGG) network. For example, VGG networks were created by increasing the number of convolutional layers while fixing other parameters of the architecture. Adding convolutional layers to increase depth is made possible by using substantially small convolutional filters in all of the layers. Like the other neural networks described herein, VGG networks were created and trained to analyze features for determining rotation and translation offsets. VGG networks also include convolutional layers followed by fully connected layers.

In some such embodiments, the deep learning model used for the semiconductor inspection applications disclosed herein is configured as a deep residual network. For example, like some other networks described herein, a deep residual network may include convolutional layers followed by fully-connected layers, which are, in combination, configured and trained for feature property extraction. In a deep residual network, the layers are configured to learn residual functions with reference to the layer inputs, instead of learning unreferenced functions. In particular, instead of hoping each few stacked layers directly fit a desired underlying mapping, these layers are explicitly allowed to fit a residual mapping, which is realized by feedforward neural networks with shortcut connections. Shortcut connections are connections that skip one or more layers. A deep residual net may be created by taking a plain neural network structure that includes convolutional layers and inserting shortcut connections which thereby takes the plain neural network and turns it into its residual learning counterpart.

In a further such embodiment, the deep learning model used for the semiconductor inspection applications disclosed herein includes one or more fully connected layers configured for analyzing features for determining rotation and translation offsets. A fully connected layer may be generally defined as a layer in which each of the nodes is connected to each of the nodes in the previous layer. The fully connected layer(s) may perform classification based on the features extracted by convolutional layer(s), which may be configured as described further herein. The fully connected layer(s) are configured for feature selection and classification. In other words, the fully connected layer(s) select features from a feature map and then analyze the input image(s) based on the selected features. The selected features may include all of the features in the feature map (if appropriate) or only some of the features in the feature map.

In some embodiments, the information determined by the deep learning model includes feature properties extracted by the deep learning model. In one such embodiment, the deep learning model includes one or more convolutional layers. The convolutional layer(s) may have any suitable configuration known in the art. In this manner, the deep learning model (or at least a part of the deep learning model) may be configured as a CNN. For example, the deep learning model may be configured as a CNN, which is usually stacks of convolution and pooling layers, to extract local features. The embodiments described herein can take advantage of deep learning concepts such as a CNN to solve the normally intractable representation inversion problem. The deep learning model may have any CNN configuration or architecture known in the art. The one or more pooling layers may also have any suitable configuration known in the art (e.g., max pooling layers) and are generally configured for reducing the dimensionality of the feature map generated by the one or more convolutional layers while retaining the most important features.

In general, the deep learning model described herein is a trained deep learning model. For example, the deep learning model may be previously trained by one or more other systems and/or methods. The deep learning model is already generated and trained and then the functionality of the model is determined as described herein, which can then be used to perform one or more additional functions for the deep learning model.

As stated above, although a CNN is used herein to illustrate the architecture of a deep learning system, the present disclosure is not limited to a CNN. Other variants of deep learning architectures may be used in embodiments. For example, Auto-Encoders, DBNs, and RBMs, can be used. Random forests also can be used.

Training data may be inputted to model training (e.g., CNN training), which may be performed in any suitable manner. For example, the model training may include inputting the training data to the deep learning model (e.g., a CNN) and modifying one or more parameters of the model until the output of the model is the same as (or substantially the same as) external validation data. Model training may generate one or more trained models, which may then be sent to model selection, which is performed using validation data. The results that are produced by each one or more trained models for the validation data that is input to the one or more trained models may be compared to the validation data to determine which of the models is the best model. For example, the model that produces results that most closely match the validation data may be selected as the best model. Test data may then be used for model evaluation of the model that is selected (e.g., the best model). Model evaluation may be performed in any suitable manner. Best model may also be sent, to model deployment in which the best model may be sent to the semiconductor inspection tool for use (post-training mode).

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

Although the present disclosure has been described with respect to one or more particular embodiments, it will be understood that other embodiments of the present disclosure may be made without departing from the scope of the present disclosure.

What is claimed is:

1. A method, comprising:
emitting an electron beam towards a specimen;
modulating a beam current of the electron beam to obtain a beam signal;
detecting, using an electron detector, secondary and/or backscattered electrons emitted by the specimen to obtain electron data, wherein the electron data defines a detection signal;
determining, using a processor, a latency between a sine wave controlling the beam signal and a sine wave for the detection signal; and
filtering, using the processor, the detection signal based on the latency.

2. The method of claim 1, wherein the method further comprises:
applying a high-pass filter to the detection signal to obtain backscattered electron data.

3. The method of claim 2, wherein filtering the detection signal further includes subtracting the backscattered electron data from the electron data to obtain secondary electron data.

4. The method of claim 2, wherein filtering the detection signal further includes:
extrapolating, using the processor, a spectral distribution of the backscattered electron data towards a lower energy, thereby yielding an extrapolated backscattered electron data; and
subtracting, using the processor, the extrapolated backscattered electron data from the electron data to obtain secondary electron data.

5. The method of claim 2, wherein filtering the detection signal further includes:
modelling, using the processor, an energy distribution function of the backscattered electron data, thereby yielding a modeled energy distribution function; and
calibrating, using the processor, the modeled energy distribution function using one or more measurements taken using an electron beam tool.

6. The method of claim 2, wherein filtering the detection signal further includes determining a relative fraction that is a ratio of an intensity of the backscattered electron data compared to an intensity of the electron data.

7. The method of claim 6, further comprising storing the relative fraction on an electronic data storage unit.

8. The method of claim 7, wherein filtering the detection signal further includes using a machine learning model, the machine learning model trained using the stored relative fraction stored on the electronic data storage unit.

9. The method of claim 2, further comprising:
detecting, using an opposing electron detector, secondary and/or backscattered electrons emitted by the specimen to obtain opposing electron data;
comparing, using the processor, the electron data and the opposing electron data to generate tilt data; and
changing a tilt of the electron beam using the tilt data.

10. A system, comprising:
an electron beam tool including:
an electron beam emitter configured to emit electrons in an electron beam towards a specimen;
a stage configured to hold the specimen;
an electron detector configured to detect secondary and/or backscattered electrons emitted by the specimen to obtain electron data, wherein the electron data defines a detection signal; and
a controller in electronic communication with the electron beam tool, the controller having a processor;
wherein the controller is configured to:
instruct the electron beam emitter to modulate a beam current of the electron beam to obtain a beam signal;
determine a latency between a sine wave controlling the beam signal and a sine wave for the detection signal; and
filter the detection signal using the latency.

11. The system of claim 10, wherein the controller is further configured to:
apply a high-pass filter to the detection signal to obtain backscattered electron data.

12. The system of claim 11, wherein the controller is configured to filter the detection signal further by subtracting the backscattered electron data from the electron data to obtain secondary electron data.

13. The system of claim 11, wherein the controller is configured to filter the detection signal further by:
extrapolating a spectral distribution of the backscattered electron data towards a lower energy, thereby yielding an extrapolated backscattered electron data; and
subtracting the extrapolated backscattered electron data from the electron data to obtain secondary electron data.

14. The system of claim 11, wherein the controller is configured to filter the detection signal further by:
- modelling an energy distribution function of the backscattered electron data, thereby yielding a modeled energy distribution function; and
- calibrating the modeled energy distribution function using one or more measurements taken using the electron beam tool.

15. The system of claim 11, wherein the controller is configured to filter the detection signal further by:
- determining a relative fraction that is a ratio of an intensity of the backscattered electron data compared to an intensity of the electron data.

16. The system of claim 15, further comprising an electronic data storage unit configured to store the relative fraction.

17. The system of claim 16, wherein the controller is configured to filter the detection signal further using a machine learning model, the machine learning model trained using the stored relative fraction stored on the electronic data storage unit.

18. The system of claim 11, further comprising:
- an opposing electron detector configured to detect secondary and/or backscattered electrons emitted by the specimen to obtain opposing electron data; and
- wherein the controller is further configured to:
  - compare the electron data and the opposing electron data to generate tilt data; and
  - change an angle of the electron beam emitter using the tilt data, thereby changing a tilt of the electron beam.

19. A non-transitory computer-readable storage medium, comprising one or more programs for executing the following steps on one or more computing devices:
- instructing an electron beam tool to emit an electron beam towards a specimen;
- modulating a beam current of the electron beam to obtain a beam signal;
- receiving electron data from an electron detector detecting secondary and/or backscattered electrons emitted by the specimen, wherein the electron data defines a detection signal;
- determining a latency between a sine wave controlling the beam signal and a sine wave for the detection signal; and
- filtering the detection signal based on the latency to obtain a filtered detection signal.

20. The non-transitory computer-readable storage medium of claim 19, wherein the one or more programs are further configured to execute, on one or more computing devices:
- training a machine-learning algorithm using the beam current, the electron data, and the filtered detection signal.

* * * * *